(12) United States Patent
Liu

(10) Patent No.: US 8,879,014 B2
(45) Date of Patent: Nov. 4, 2014

(54) TFT-LCD ARRAY SUBSTRATE MANUFACTURING METHOD

(71) Applicant: Beijing Boe Optoelectronics Technology Co., Ltd., Beijing (CN)

(72) Inventor: Xiang Liu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 51 days.

(21) Appl. No.: 13/846,128

(22) Filed: Mar. 18, 2013

(65) Prior Publication Data

US 2013/0260496 A1    Oct. 3, 2013

Related U.S. Application Data

(62) Division of application No. 12/703,296, filed on Feb. 10, 2010, now abandoned.

(30) Foreign Application Priority Data

Feb. 18, 2009  (CN) .......................... 2009 1 0077347

(51) Int. Cl.
| G02F 1/1343 | (2006.01) |
|---|---|
| G02F 1/136 | (2006.01) |
| G02F 1/1333 | (2006.01) |
| H01L 27/12 | (2006.01) |
| H01L 29/786 | (2006.01) |
| G02F 1/1362 | (2006.01) |
| H01L 27/13 | (2006.01) |

(52) U.S. Cl.
CPC ...... *G02F 1/13439* (2013.01); *G02F 1/136286* (2013.01); *H01L 27/1214* (2013.01); *G02F 1/136213* (2013.01); *H01L 27/12* (2013.01); *H01L 27/13* (2013.01); *H01L 29/78633* (2013.01); *G02F 2201/40* (2013.01)
USPC .............................. 349/47; 349/39; 349/111

(58) Field of Classification Search
CPC .............................................. G02F 2001/13685
USPC .................... 349/38, 39, 42, 43, 47, 110, 111
See application file for complete search history.

(56) References Cited

U.S. PATENT DOCUMENTS

| 4,723,838 A | 2/1988 | Aoki et al. |
|---|---|---|
| 5,191,453 A | 3/1993 | Okumura |

(Continued)

FOREIGN PATENT DOCUMENTS

| CN | 1438523 A | 8/2003 |
|---|---|---|
| JP | 03/080225 A | 4/1991 |

(Continued)

OTHER PUBLICATIONS

First Japanese Office Action dated Oct. 29, 2013; Appln. No. 2010-027846.

(Continued)

*Primary Examiner* — Jessica M Merlin
(74) *Attorney, Agent, or Firm* — Ladas & Parry LLP

(57) ABSTRACT

A method of manufacturing a thin film transistor liquid crystal display (TFT-LCD) array substrate including a gate line and a data line that define a pixel region, wherein the pixel region is provided with a thin film transistor, a pixel electrode formed on the array substrate, and a storage electrode of transparent structure that overlaps with the pixel electrode and, together with the pixel electrode, constitutes a storage capacitor.

5 Claims, 5 Drawing Sheets

(56) References Cited

U.S. PATENT DOCUMENTS

| | | |
|---|---|---|
| 5,872,370 A | 2/1999 | Gu et al. |
| 2001/0055008 A1 | 12/2001 | Young et al. |
| 2002/0180897 A1 | 12/2002 | Chae |
| 2003/0155588 A1 | 8/2003 | Murade |
| 2006/0033102 A1 | 2/2006 | Kim |
| 2006/0164573 A1* | 7/2006 | Tanaka .................. 349/113 |
| 2007/0114625 A1 | 5/2007 | Hsiao et al. |
| 2008/0225192 A1 | 9/2008 | Cheng et al. |
| 2009/0032819 A1 | 2/2009 | Lim et al. |
| 2009/0174835 A1* | 7/2009 | Lee et al. .................. 349/46 |

FOREIGN PATENT DOCUMENTS

| | | |
|---|---|---|
| JP | 05-273592 A | 10/1993 |
| JP | 2000-187245 A | 7/2000 |
| JP | 2001-005025 A | 1/2001 |
| JP | 2001-044439 A | 2/2001 |
| JP | 2004-151546 A | 5/2004 |
| KR | 10-0447768 B1 | 1/2005 |
| KR | 20090009613 A | 1/2009 |

OTHER PUBLICATIONS

USPTO RR mailed Sep. 26, 2011 in connection with U.S. Appl. No. 12/703,296.

USPTO NFOA mailed Nov. 2, 2011 in connection with U.S. Appl. No. 12/703,296.

USPTO FOA dated Apr. 16, 2012 in connection with U.S. Appl. No. 12/703,296.

USPTO NFOA dated Aug. 16, 2012 in connection with U.S. Appl. No. 12/703,296.

USPTO FOA dated Jan. 3, 2013 in connection with U.S. Appl. No. 12/703,296.

* cited by examiner

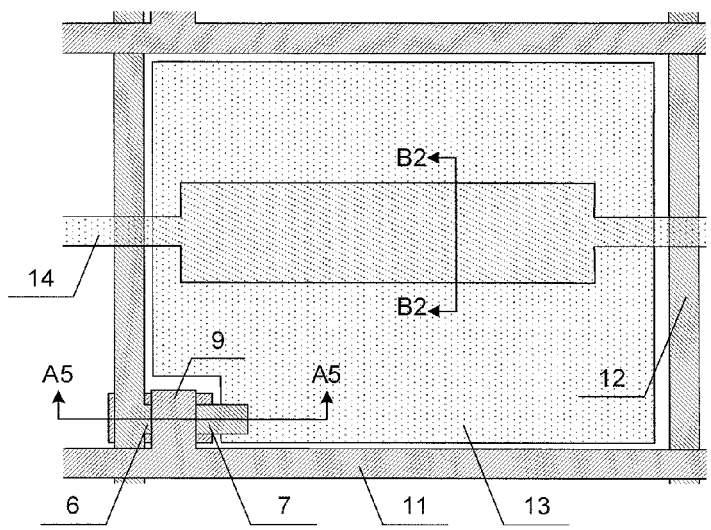
Fig. 15
A5 - A5
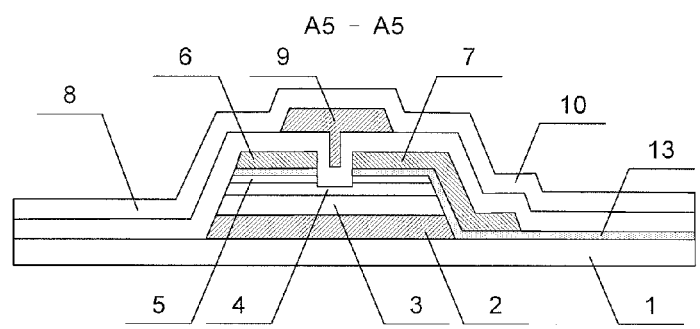
Fig. 16
B2 - B2
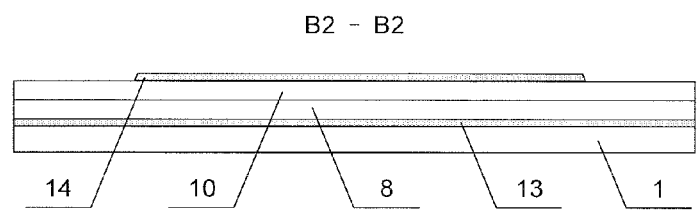
Fig. 17
gate pad region                          date pad region
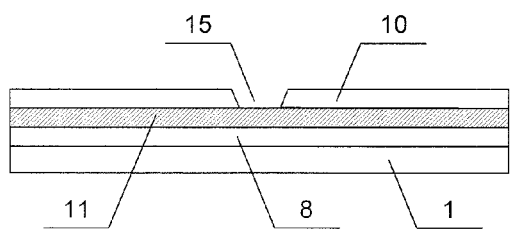   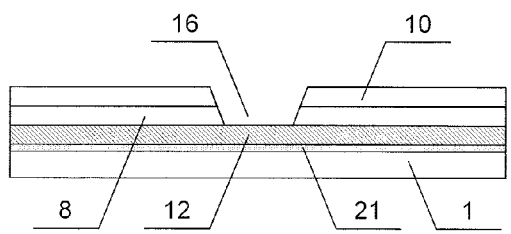
Fig. 18                                  Fig. 19

TFT-LCD ARRAY SUBSTRATE MANUFACTURING METHOD

BACKGROUND

The invention relates to a thin film transistor liquid crystal display (TFT-LCD) array substrate and a manufacturing method thereof.

A thin film transistor liquid crystal display (TFT-LCD) has the advantage of small volume, low energy consumption, low radiation, and etc., and thus prevails in the flat panel display market.

A TFT-LCD typically constitutes of an array substrate and a color filter substrate that face each other. The array substrate is provided with thin film transistors and pixel electrodes, arranged in matrix, each pixel electrode being controlled by a thin film transistor. The pixel electrode is charged when the thin film transistor is on. After charging, the voltage of the pixel electrode remains unchanged until recharging at the time of next scanning. Generally speaking, the capacitance of liquid crystal is small; and thus mere capacitance of the liquid crystal is not able to sustain the voltage of the pixel electrode. For this reason, it is worth providing a storage capacitor to sustain the voltage of the pixel electrode. In principal, a storage capacitor is categorized as a storage capacitor on a gate line (Cs on Gate), a storage capacitor on a common electrode line (Cs on Common), or a combination structure thereof. The combination structure refers to a structure where a portion of the storage capacitors is formed on a gate line and another portion is formed on a common electrode line.

When a TFT-LCD operates, a kickback (jump) voltage $\Delta V_p$ is generated at the moment the charging of the pixel electrode is finished, due to the parasitic capacitances between the source and the gate electrode and between the drain and the gate electrode. The kickback voltage $\Delta V_p$ is expressed as follows:

$$\Delta V_p = (V_{gh} - V_{gl}) \frac{C_{gs}}{C_{gs} + C_{lc} + C_s},$$

where $V_{gh}$ stands for a turn-on voltage of the gate electrode, $V_{gl}$ is a turn-off voltage of the gate electrode, $C_{lc}$ signifies the liquid crystal capacitance, $C_{gs}$ is the parasitic capacitance, and $C_s$ stands for the storage capacitance. Research has shown that the polarity of the pixel electrode varies due to the kickback voltage $\Delta V_p$, and thus the voltage difference between the positive and the negative polarity varies, which causes flickering of the display and thus severe deterioration of the display quality. Thereupon, it is necessary to reduce the kickback voltage $\Delta V_p$ as much as possible, for the sake of designing. Although the kickback voltage $\Delta V_p$ can be reduced by reducing the parasitic capacitance $C_{gs}$, it is unfeasible to totally eliminate the parasitic capacitance, due to limit of the TFT-LCD manufacturing process. The prior art reduces the kickback voltage $\Delta V_p$ through increasing the storage capacitance $C_s$, which, however, has the following problems:

(1) Regarding the storage capacitor on the gate line, the kickback voltage $\Delta V_p$ can not be effectively reduced, because the capacitance of the storage capacitor is small;

(2) Regarding the storage capacitor on the common electrode line, the kickback voltage $\Delta V_p$ can be, indeed, effectively reduced, thanks to the large capacitance of the storage capacitor, nevertheless, typically made of gate metal thin film materials, the common electrode line blocks a portion of the pixel region, and thus decreases the aperture ratio and the display luminance;

(3) Regarding the combination structure, though alleviating the above two problems, the combination structure renders the TFT-LCD structure complicated, which adds complexity to the manufacturing process and adversely influences the product quality.

SUMMARY OF THE INVENTION

One embodiment of the invention provides a TFT-LCD array substrate, comprising a gate line and a data line that define a pixel region, wherein the pixel region is provided with a thin film transistor, a pixel electrode formed on a base substrate, and a storage electrode of transparent structure that overlaps with the pixel electrode and, together with the pixel electrode, constitutes a storage capacitor.

Another embodiment of the invention provides a method of manufacturing a TFT-LCD array substrate, comprising steps of:

Step 1, depositing, successively, a light-blocking metal film, a first insulating layer, a semiconductor film, and a doped semiconductor film on a base substrate, and forming a pattern including a light-blocking metal layer and an active layer using patterning process;

Step 2, depositing, successively, a transparent conductive film and a source and drain metal film on the base substrate after Step 1, and forming a pattern including a data line, a drain electrode, a source electrode, a TFT channel region, and a pixel electrode using patterning process, wherein the drain electrode is directly connected with the pixel electrode through the transparent conductive layer, and the transparent conductive layer below the drain electrode is continuously formed together with the pixel electrode;

Step 3, depositing, successively, a second insulating layer and a gate metal film on the base substrate after Step 2, and forming a pattern including a gate electrode and a gate line using patterning process, wherein the gate electrode is located above the TFT channel region;

Step 4, depositing, successively, a third insulating layer and a transparent conductive film on the base substrate after Step 3, and forming a pattern including a storage electrode, a gate pad via hole, and a data pad via hole, wherein the storage electrode overlaps with the pixel electrode and, together with the pixel electrode, constitutes a storage capacitor.

A further scope of the invention will become apparent from the detailed description given hereinafter. However, it is understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

FIG. 15 is a plan view after the fourth patterning process of the TFT-LCD array substrate according to the embodiment of the invention;

FIG. 16 is a sectional view taken along line A5-A5 of FIG. 15;

FIG. 17 is a sectional view taken along line B2-B2 of FIG. 15;

FIG. 18 is a sectional view showing the gate pad region after the fourth patterning process of the TFT-LCD array substrate according to the embodiment of the invention; and FIG. 19 is a sectional view showing the data pad region after the fourth patterning process of the TFT-LCD array substrate according to the embodiment of the invention.

DESCRIPTION OF THE EMBODIMENTS

Hereinafter, the invention will be described in detail with reference to the accompanying drawings and the embodiments.

Figure 1:
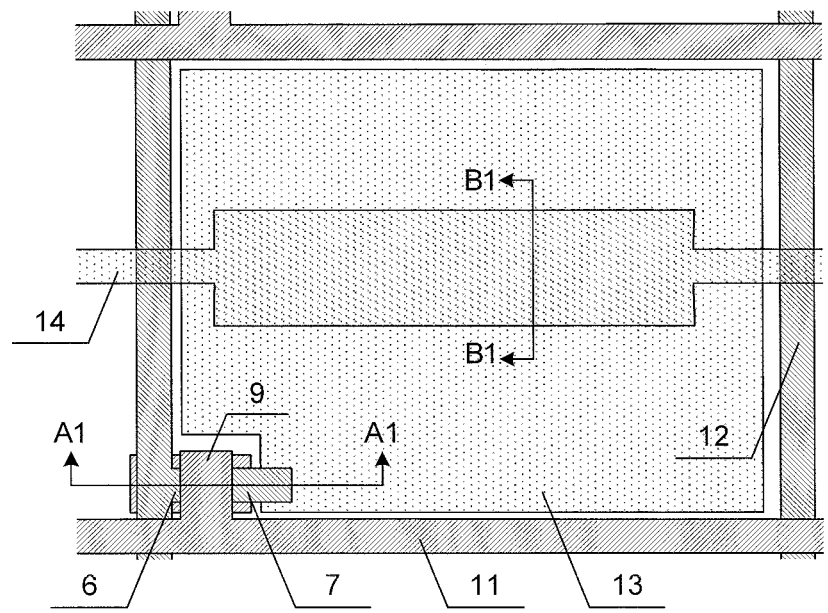
FIG. 1 is a plan view of a TFT-LCD array substrate according to an embodiment of the invention.
Figure 2:
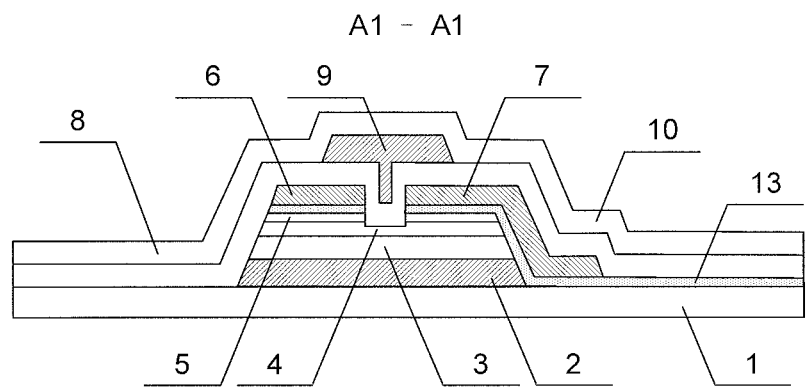
FIG. 2 is a sectional view taken along line A1-A1 of FIG. 1.

FIG. 1 is a plan view of a TFT-LCD array substrate according to an embodiment, showing the structure of one pixel unit. FIG. 2 is a sectional view taken along line A1-A1 of FIG. 1, and FIG. 3 is a sectional view taken along line B1-B1 of FIG. 1.

Figure 3:
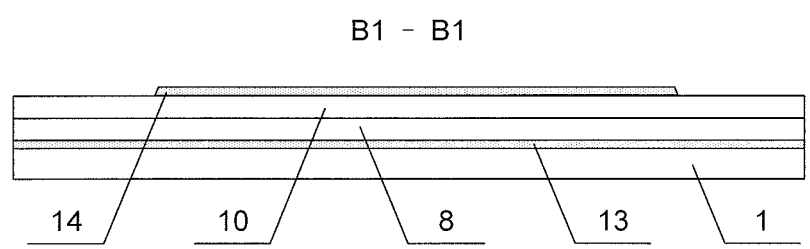
FIG. 3 is a sectional view taken along line B1-B1 of FIG. 1.

As shown in FIG. 1 to FIG. 3, the main body of the TFT-LCD array substrate according to an embodiment of the invention comprises: a gate line 11, a data line 12, a pixel electrode 13, a storage electrode 14, and a thin film transistor formed on the base substrate 1. A pixel region is defined by the gate line 11 and the data line 12, which are perpendicular to each other. The thin film transistor and the pixel electrode 13 are formed in the pixel region. The gate line 11 provides turn-on signals to the thin film transistor, while the data line 12 provides data signals to the pixel electrode 13. The storage electrode 14 of transparent structure, together with the pixel electrode 13, constitutes the storage capacitor. For example, the storage electrode 14 of transparent structure is made of transparent conductive film such as indium tin oxide (ITO), indium zinc oxide (IZO), and aluminum zinc oxide, and is formed in the pixel region and above the pixel electrode 13.

For example, the thin film transistor of the TFT-LCD array substrate according to the embodiment includes a light-blocking metal layer 2 and a first insulating layer 3, formed on the base substrate 1; an active layer (including a semiconductor layer 4 and a doped semiconductor layer 5), formed on the first insulating layer 3; the pixel electrode 13, formed on the base substrate within the pixel region; a source electrode 6, one end of which is formed on the active layer through a transparent conductive layer, and the other end of which is connected with the data line 12; a drain electrode 7, one end of which is formed on the active layer 4 through a transparent conductive layer, and the other end of which is directly connected with the pixel electrode 13, because the transparent conductive layer below the drain electrode 7 is continuously formed together with the pixel electrode 13; a TFT channel region, formed between the source electrode 6 and the drain electrode 7, wherein in the TFT channel region, the transparent conductive layer, and the doped semiconductor layer 5 (i.e. the ohmic contact layer) are completely etched and the semiconductor layer 4 is partially etched in the thickness direction thereof, so as to expose the semiconductor layer 4 in the TFT channel region; a second insulating layer 8, formed on the pattern of the above-described structure and covering the entire surface of the base substrate 1; a gate electrode 9, formed above the TFT channel region and connected with the gate line 11; a third insulating layer 10, formed on the pattern of the above-described structure and covering the entire surface of the base substrate 1; and the storage electrode 14 of the transparent structure, formed on the third insulating layer 10 and, together with the pixel electrode 13, constitutes the storage capacitor.

FIG. 4 to FIG. 19 are schematic views showing the manufacturing process of the TFT-LCD array substrate according to the embodiment. Hereinafter, a patterning process in the invention includes processes of applying a photoresist layer, masking, exposing, etching, and etc. A positive photoresist is used as the example of the photoresist.

Figure 4:
FIG. 4 is a plan view after the first patterning process of the TFT-LCD array substrate according to an embodiment of the invention.
Figure 5:
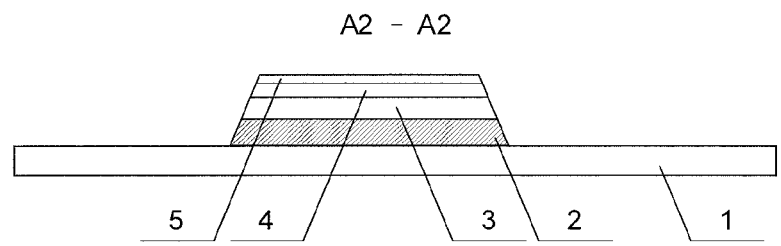
FIG. 5 is a sectional view taken along line A2-A2 of FIG. 4.

FIG. 4 is a plan view after the first patterning process of the TFT-LCD array substrate according to the embodiment, showing the structure of one pixel unit. FIG. 5 is a sectional view taken along line A2-A2 of FIG. 4. First, a light-blocking metal layer with a thickness of 500 Å~2000 Å is deposited on the base substrate 1, such as a glass substrate or a quartz substrate, by magnetron sputtering or thermal evaporation; the light-blocking metal layer can be made of metal materials that substantially block light, such as Cr. Then, a first insulating layer with a thickness of 1000 Å~3000 Å, a semiconductor film with a thickness of 1000 Å~3000 Å, and a doped semiconductor film with a thickness of 300 Å~1000 Å are successively deposited by a plasma-enhanced chemical vapor deposition (PECVD) method. The first insulating layer can be formed of oxides, nitrides, or a mixture thereof; the reactant gas for the first insulating layer can be a mixture of $SiH_4$, $NH_3$, and $N_2$, or a mixture of $SiH_2Cl_2$, $NH_3$, and $N_2$. The reactant gas for the semiconductor film can be a mixture of $SiH_4$ and $H_2$, or a mixture of $SiH_2Cl_2$ and $N_2$. The reactant gas for the doped semiconductor film can be a mixture of $SiH_4$, $PH_3$, and $H_2$, or a mixture of $SiH_2Cl_2$, $PH_3$, and $H_2$. The doped semiconductor film, the semiconductor film, the first insulating layer, and the light-blocking metal layer are patterned by a patterning process with a normal mask, so as to form a pattern including the light-blocking metal layer and the active layer. After the first patterning process, the light-blocking metal layer 2, the first insulating layer 3, the semiconductor layer 4, and the doped semiconductor layer 5 are successively formed on the base substrate 1; the semiconductor layer 4 and the doped semiconductor layer 5 constitute the active layer, as shown in FIG. 4 and FIG. 5.

Figure 6:
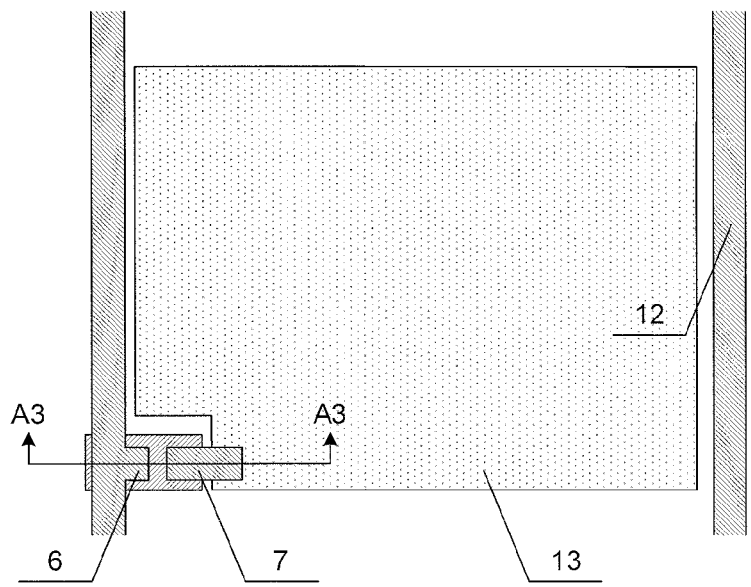
FIG. 6 is a plan view after the second patterning process of the TFT-LCD array substrate according to the embodiment of the invention.
Figure 7:
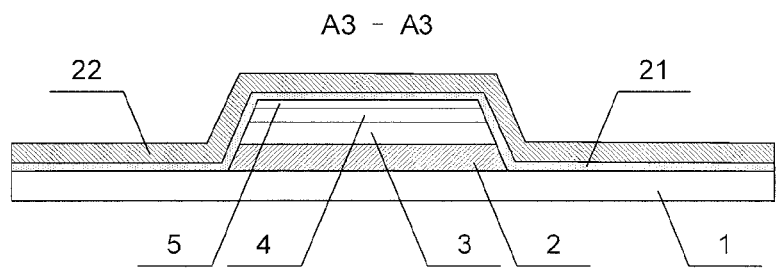
FIG. 7 is a sectional view taken along line A3-A3 after each layer is deposited during the second patterning process of the TFT-LCD array substrate according to the embodiment of the invention.

FIG. 6 is a plan view after the second patterning process of the TFT-LCD array substrate according to the embodiment, showing the structure of one pixel unit. FIG. 7 is a sectional view taken along line A3-A3 after each layer is deposited during the second patterning process of the TFT-LCD array substrate according to the embodiment. On the base substrate after the above patterning process, a transparent conductive film 21 with a thickness of 300 Å~600 Å, a source and drain metal film 22 with a thickness of 2000 Å~3000 Å are successively deposited by magnetron sputtering or thermal evaporation, as shown in FIG. 7. The transparent conductive film 21 can be formed of indium tin oxide (ITO), indium zinc oxide (ITO), or aluminum zinc oxide, or formed of other metal materials or metal oxides. The source and drain metal film 22 can be formed of Cr, W, Ti, Ta, Mo, Al, Cu, and the like, or alloys, or formed of a composite film of multi-layer metal film.

Figure 8:
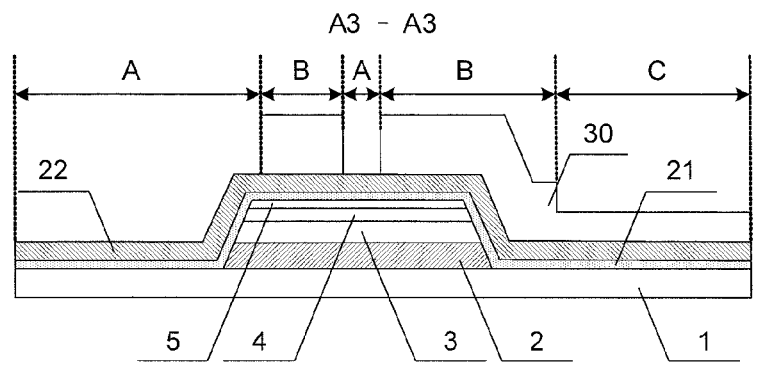
FIG. 8 is a sectional view taken along line A3-A3 after an exposing process and a developing process during the second patterning process of the TFT-LCD array substrate according to the embodiment of the invention.

FIG. 8 is a sectional view along line A3-A3 after an exposing process and a developing process during the second patterning process of the TFT-LCD array substrate according to the embodiment. A photoresist layer 30 is applied on the source and drain metal film 22, then the exposing process is performed through using a half-tone mask or a gray-tone mask (also referred to as a dual-tone mask) to form a fully exposed region A, an unexposed region B, and a partially exposed region C in the photoresist layer. Specifically, the unexposed region B corresponds to a region where a pattern to be formed of the data line, the source electrode, and the drain electrode is, the partially exposed region C corresponds to the region where a pattern to be formed of the pixel electrode is, and the fully exposed region corresponds to the region other than the above regions. After the developing process, the thickness of the photoresist in the unexposed region B remains unchanged, forming a photoresist-wholly-retained region; the photoresist in the fully exposed region A is completely removed, forming a photoresist-completely-removed region, and the thickness of the photoresist in the partially exposed region C is reduced, forming a photoresist-partially-retained region, as shown in FIG. 8.

Figure 9:
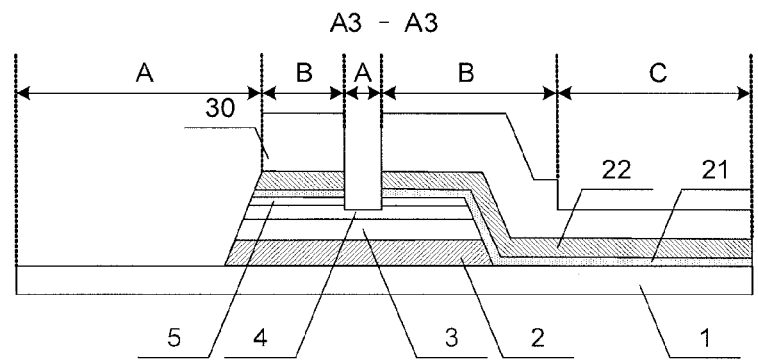
FIG. 9 is a sectional view taken along line A3-A3 after the first etching process during the second patterning process of the TFT-LCD array substrate according to the embodiment of the invention.

FIG. 9 is a sectional view along line A3-A3 after the first etching process during the second patterning process of the TFT-LCD array substrate according to the embodiment. Through the first etching process, the source and drain metal film 22 and the transparent conductive film 21 in the fully exposed region A are completely etched to form a pattern including the data line and the TFT channel region. In the TFT channel region, the source and drain metal film 22, the transparent conductive film 21, and the doped semiconductor layer 5 are completely etched and the semiconductor layer 4 is partially etched in the thickness direction thereof so that the semiconductor layer 4 in the TFT channel region is exposed, as shown in FIG. 9.

Figure 10:
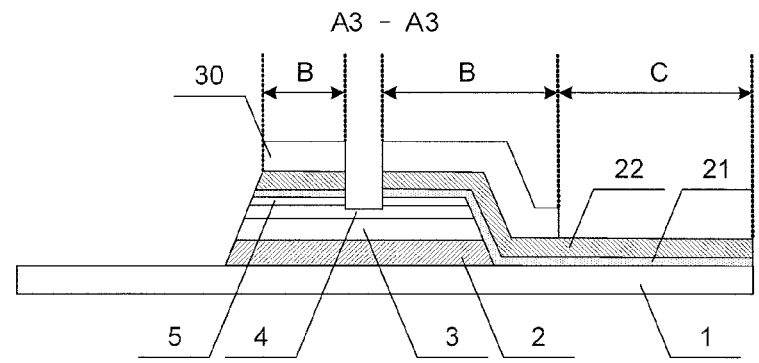
FIG. 10 is a sectional view taken along line A3-A3 after the ashing process during the second patterning process of the TFT-LCD array substrate according to the embodiment of the invention.

FIG. 10 is a sectional view taken along line A3-A3 after the ashing process during the second patterning process of the TFT-LCD array substrate according to the embodiment. Through the ashing process, the photoresist in the partially exposed region C is removed to expose the source and drain metal film 22 in this region, as shown in FIG. 10. Since the thickness of the photoresist in the unexposed region B is larger than that in the partially exposed region C, the unexposed region B is still covered by the photoresist 30 with certain thickness after the ashing process.

Figure 11:
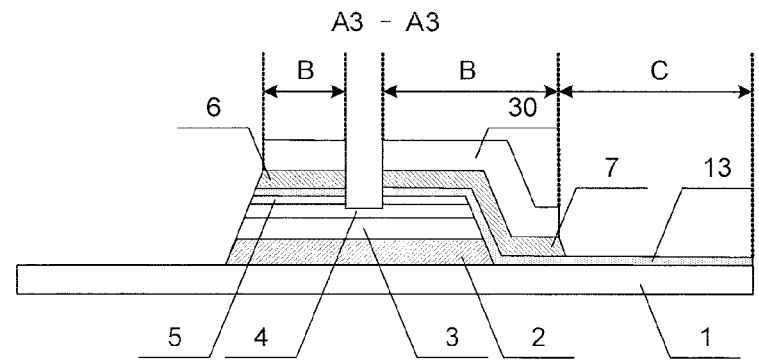
FIG. 11 is a sectional view taken along line A3-A3 after the second etching process during the second patterning process of the TFT-LCD array substrate according to the embodiment of the invention.

FIG. 11 is a sectional view taken along line A3-A3 after the second etching process during the second patterning process of the TFT-LCD array substrate according to the embodiment. Through the second etching process, the source and drain metal film 22 in the partially exposed region C is completely etched and the transparent conductive film in the pixel region is exposed, forming a pattern including the pixel electrode 13, the source electrode 6, and the drain electrode 7. The portion of the transparent conductive layer below the source electrode 6 and the drain electrode 7 is retained. Since the portion of the transparent conductive layer below the drain electrode 7 is continuously formed together with the pixel electrode, the pixel electrode 13 is directly connected with the drain electrode 7, as shown in FIG. 11. The direct connection between the pixel electrode 13 and the drain electrode 7 enhances the electrical contact thereby and thus improves quality of the product.

Figure 12:
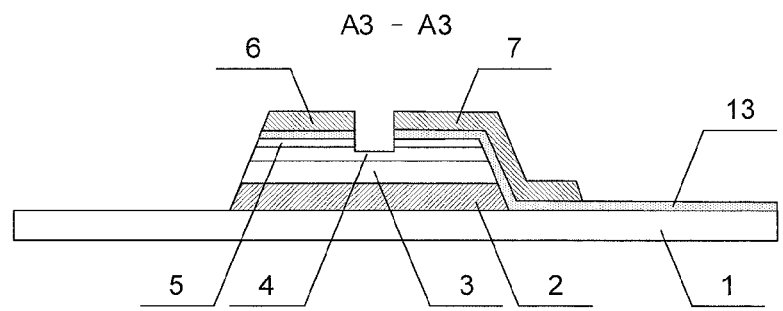
FIG. 12 is a sectional view taken along line A3-A3 after the second patterning process of the TFT-LCD array substrate according to the embodiment of the invention.

FIG. 12 is a sectional view taken along line A3-A3 after the second patterning process of the TFT-LCD array substrate according to the embodiment. The remaining photoresist is peeled off, finalizing the second patterning process of the TFT-LCD array substrate, as shown in FIG. 6 and FIG. 12. After the second patterning process, the pixel electrode 13 is formed in the pixel region; one end of the source electrode 6 is located on the active layer, and the other end of the source electrode 6 is connected with the data line 12; one end of the drain electrode 7 is located on the active layer, and the other end of the drain electrode 7 is connected with the pixel electrode 13; and the TFT channel region is formed between the source electrode 6 and the drain electrode 7. In the TFT channel region, the doped semiconductor layer 5 is completely etched and the semiconductor layer 4 is partially etched in the thickness direction thereof, so that the semiconductor layer 4 in the TFT channel region is exposed and the portion of the transparent conductive film below the data line 12, the source electrode 6, and the drain electrode 7 is retained.

Figure 13:
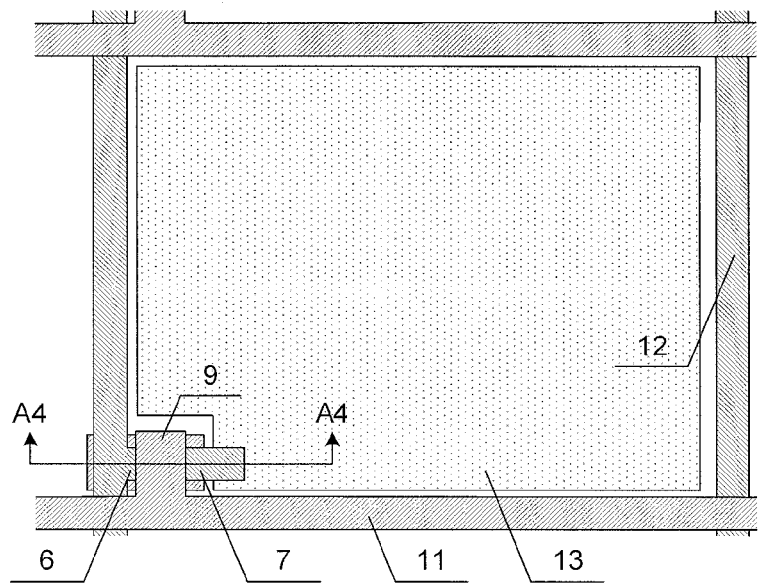
FIG. 13 is a plan view after the third patterning process of the TFT-LCD array substrate according to the embodiment of the invention.
Figure 14:
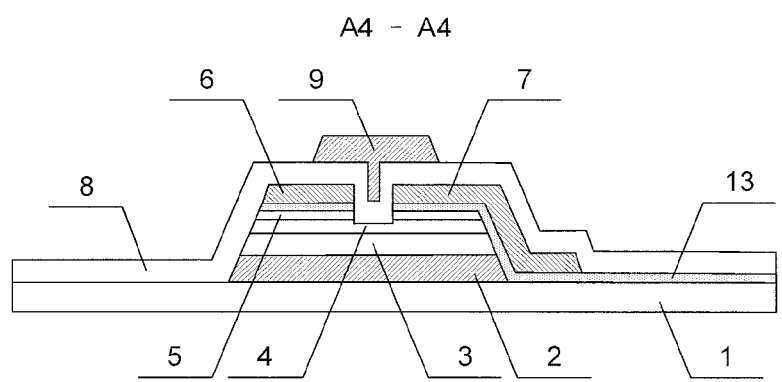
FIG. 14 is a sectional view taken along line A4-A4 of FIG. 13.

FIG. 13 is a plan view after the third patterning process of the TFT-LCD array substrate according to the embodiment, showing one pixel unit. FIG. 14 is a sectional view taken along line A4-A4 of FIG. 13. On the base substrate after the above patterning process, a second insulating layer 8 with a thickness of 3000 Å~5000 Å is deposited through PECVD. Then, a gate metal film with a thickness of 500 Å~4000 Å is deposited on the second insulating layer 8 by magnetron sputtering or thermal evaporation. For example, the second insulating layer 8 can be formed of oxides, nitrides, or a mixture thereof, and the gate metal film can be formed of Cr, W, Ti, Ta, Mo, Al, Cu, and the like, or alloys, or formed of a composite film of multi-layer metal film. The gate metal film is patterned by a third patterning process with a normal mask, so as to form a pattern including the gate electrode 9 and the gate line 11. The gate electrode 9 is located above the TFT channel region, as shown in FIG. 13 and FIG. 14.

FIG. 15 is a plan view after the fourth patterning process of the TFT-LCD array substrate according to the embodiment, showing the structure of one pixel unit. FIG. 16 is a sectional view taken along line A5-A5 of FIG. 15, while FIG. 17 is a sectional view taken along line B2-B2 of FIG. 15. FIG. 18 is a sectional view showing the gate pad region after the fourth patterning process of the TFT-LCD array substrate according to the embodiment, while FIG. 19 is a sectional view showing the data pad region after the fourth patterning process of the TFT-LCD array substrate according to the embodiment. On the base substrate after the above patterning process, a third insulating layer 10 with a thickness of 2000 Å~4000 Å is deposited by PECVD. Then, a transparent conductive film with a thickness of 300 Å~600 Å is deposited on the third insulating layer 10 by magnetron sputtering or thermal evaporation. The third insulating layer 10 can be formed of oxides, nitrides, or a mixture thereof, and the transparent conductive film can be formed of indium tin oxide (ITO), indium zinc oxide (ITO), or aluminum zinc oxide, or formed of other metal materials or metal oxides. A photoresist layer is applied on the transparent conductive film, and then a fully exposed region, an unexposed region, and a partially exposed region are formed in the photoresist layer through using a half-tone mask or a gray-tone mask. Specifically, the fully exposed region corresponds to the region with a pattern of a gate pad via hole of the gate pad region and a data pad via hole of the data pad region thereupon, the unexposed region corresponds to the region where a pattern to be formed of the storage electrode is thereupon, and the partially exposed region corresponds to the region other than the above regions. After the developing process, the thickness of the photoresist in the unexposed region remains unchanged, forming a region where the photoresist is completely retained, the photoresist in the fully exposed region is completely removed, forming a photoresist-completely-removed region, and the thickness of the photoresist in the partially exposed region is reduced, forming a photoresist-partially-retained region. The transparent conductive film and the corresponding insulating layer in the fully exposed region are etched by the first etching process during the fourth patterning process of the TFT-LCD array substrate, so as to form the gate pad via hole 15 and the data pad via hole 16. Specifically, the third insulating layer 10 is etched at the gate pad via hole 15 to expose the surface of the gate line 11, and the third insulating layer 10 and the second insulating layer 8 are etched at the data pad via hole 16 to expose the surface of the data line 12. Next, the ashing process is performed to remove the photoresist in the partially exposed region, so as to expose the transparent conductive film in this region. The transparent conductive film in the partially exposed region is etched by the second etching process during the fourth patterning process of the TFT-LCD array substrate, and a pattern of the transparent storage electrode 14 is formed after the retained photoresist is peeled off, as shown in FIG. 15 to FIG. 18. After the fourth patterning process, the storage electrode 14 is formed in the pixel region, located above pixel electrode 13, and the second insulating layer 8 and the third insulating layer 10 are sandwiched between the storage electrode 14 and the pixel electrode 13.

The above-described four patterning processes is merely one of the methods for manufacturing the TFT-LCD array substrate according to the embodiment of the invention; in practice, the TFT-LCD array substrate according to the embodiment of the invention can be obtained through decreasing or increasing the number of patterning processes, or through employing other materials or a combination of materials. For example, the second patterning process of the TFT-LCD array substrate according to the embodiment can be accomplished by two patterning processes, i.e., a pattern of the pixel electrode can be formed by one patterning process with a normal mask and the pattern of the data line, the source electrode, the drain electrode, and the TFT channel region can be formed by another patterning process with a normal mask. For another example, the fourth patterning process of the TFT-LCD array substrate according to the embodiment can be accomplished by two patterning processes, i.e., a pattern of the storage electrode can be formed by one patterning process with a normal mask, and the pattern of the gate pad via hole and the data pad via hole can be formed by another patterning process with a normal mask. For still another example, the first patterning process and the second patterning process in the embodiment can be reorganized, i.e., the light-blocking pattern can be formed by the first patterning process, and the pattern of the active layer, the data line, the source electrode, the drain electrode, and the pixel electrode can be formed by the second patterning process.

In the embodiment, a TFT-LCD array substrate is provided. Through forming the storage electrode made of the transparent conductive film in the pixel region, both electrode plates of the storage capacitor are made transparent. Since the storage electrodes are transparent, the storage capacitor can be properly designed through varying the area of the storage electrodes according to practical needs, which secures enough storage capacitance, effectively reduces the kickback voltage $\Delta V_p$, and thus improves the display quality. The storage electrode of transparent structure in the invention does not block the pixel region and thus the aperture ratio and the display luminance can be effectively increased, which improves display quality as a whole.

The embodiment of the method of manufacturing the TFT-LCD array substrate of the invention comprises steps of:

Step 1, depositing, successively, a light-blocking metal film, a first insulating layer, a semiconductor film, and a doped semiconductor film on a base substrate, and forming a pattern including a light-blocking metal layer and an active layer using patterning process;

Step 2, depositing, successively, a transparent conductive film and a source and drain metal film on the base substrate after Step 1, and forming a pattern including a data line, a drain electrode, a source electrode, a TFT channel region, and a pixel electrode using patterning process, wherein the drain electrode is directly connected with the pixel electrode through the transparent conductive layer, and the transparent conductive layer below the drain electrode is continuously formed together with the pixel electrode;

Step 3, depositing, successively, a second insulating layer and a gate metal film on the base substrate after Step 2, and forming a pattern including a gate electrode and a gate line using patterning process, wherein the gate electrode is located above the TFT channel region;

Step 4, depositing, successively, a third insulating layer and a transparent conductive film on the base substrate after Step 3, and forming a pattern including a storage electrode, a gate pad via hole, and a data pad via hole.

In the above embodiment of the method of manufacturing the TFT-LCD array substrate of the invention, the TFT-LCD array substrate can be manufactured through the four patterning processes. Through forming the storage electrode made of the transparent conductive film in the pixel region, both electrode plates of the storage capacitor are made transparent. Since the storage electrodes are transparent, the storage capacitor can be properly designed through varying the area of the storage electrodes according to practical needs, which secures enough storage capacitance, effectively reduces the kickback voltage $\Delta V_p$, and thus improves the display quality. The storage electrode of transparent structure in the invention does not block the pixel region and thus the aperture ratio and the display luminance can be effectively increased, which improves display quality as a whole.

In Step 1, first, a light-blocking metal layer with a thickness of 500 Å~2000 Å is deposited on the base substrate, such as a glass substrate or a quartz substrate, by magnetron sputtering or thermal evaporation; the light-blocking metal layer can be made of metal materials that substantially block light, such as Cr. Then, a first insulating layer with a thickness of 1000 Å~3000 Å, a semiconductor film with a thickness of 1000 Å~3000 Å, and a doped semiconductor film with a thickness of 300 Å~1000 Å are successively deposited by a plasma-enhanced chemical vapor deposition (PECVD) method. The first insulating layer can be formed of oxides, nitrides, or a mixture thereof; the reactant gas for the first insulating layer can be a mixture of $SiH_4$, $NH_3$, and $N_2$, or a mixture of $SiH_2Cl_2$, $NH_3$, and $N_2$. The reactant gas for the semiconductor film can be a mixture of $SiH_4$ and $H_2$, or a mixture of $SiH_2Cl_2$ and $H_2$. The reactant gas for the doped semiconductor film can be a mixture of $SiH_4$, $PH_3$, and $H_2$, or a mixture of $SiH_2Cl_2$, $PH_3$, and $H_2$. The doped semiconductor film, the semiconductor film, the first insulating layer, and the light-blocking metal layer are patterned by patterning process with a normal mask, so as to form a pattern including the light-blocking metal layer and the active layer.

In the embodiment of the method of manufacturing the TFT-LCD array substrate of the invention, an example of the process of forming a pattern of the data line, the source electrode, the drain electrode, the TFT channel region, and the pixel electrode may include the following steps:

Step 21, depositing, successively, the transparent conductive film and the source and drain metal film by magnetron sputtering or thermal evaporation;

Step 22, applying a photoresist layer on the source and drain metal film;

Step 23, performing a exposing process through using a half-tone mask or a gray-tone mask to form a photoresist-completely-removed region, a photoresist-wholly-retained region, and a photoresist-partially-retained region, wherein the photoresist-wholly-retained region corresponds to the region where a pattern to be formed of the data line, the source electrode, and the drain electrode is, the photoresist-partially-retained region corresponds to the region where a pattern to be formed of the pixel electrode is, and the photoresist-completely-removed region corresponds to the region other than the above regions, and wherein after a developing process, the thickness of the photoresist in the photoresist-wholly-retained region remains unchanged, the photoresist in the photoresist-completely-removed region is completely removed, and the thickness of the photoresist in the photoresist-partially-retained region is reduced;

Step 24, completely etching the source and drain metal film and the transparent conductive film in the photoresist-completely-removed region by a first etching process, so as to form a pattern of the data line, the source electrode, the drain electrode, and the TFT channel region, wherein one end of the source electrode is formed on the active layer and the other end of the source electrode is connected with the data line, one end of the drain electrode is formed on the active layer against the source electrode, the TFT channel region is formed between the source electrode and the drain electrode, and the source and drain metal film, the transparent conductive film, and the doped semiconductor layer in the TFT channel region are completely etched, and the semiconductor layer in this region is partially etched in the thickness direction thereof, so as to expose the semiconductor layer in the TFT channel region;

Step 25, removing the photoresist in the photoresist-partially-retained region by an ashing process to expose the source and drain metal film in this region;

Step 26, completely etching the source and drain metal film in the photoresist-partially-retained region by a second etching process, so as to form a pattern of the pixel electrode, wherein the pixel electrode is directly connected with the drain electrode:

Step 27, peeling off the remaining photoresist.

The technology of the embodiment offers an approach in which a pattern of the data line, the source electrode, the drain electrode, the TFT channel region, and the pixel electrode are formed at the same time through using a plurality of etching processes in one patterning process. The details thereof have been described in the technology shown in FIG. 6 to FIG. 12, and thus the explanation thereof is omitted for brevity's sake.

In Step 3 of the embodiment, a second insulating layer with a thickness of 3000 Å~5000 Å is deposited by PECVD. Then, a gate metal film with a thickness of 500 Å~4000 Å is deposited on the second insulating layer by magnetron sputtering or thermal evaporation. For example, the second insulating layer can be formed of oxides, nitrides, or a mixture thereof, and the gate metal film can be formed by Cr, W, Ti, Ta, Mo, Al, Cu, and the like, or alloys, or formed of a composite film of multi-layer metal film. The gate metal film is patterned by a third patterning process with a normal mask, so as to form a pattern including the gate electrode and the gate line. The gate electrode is located above the TFT channel region.

In the embodiment of the method of manufacturing the TFT-LCD array substrate of the invention, an example of the process of forming a pattern of the gate pad via hole, the data pad via hole, and the storage electrode may include the following steps:

Step 41, depositing the third insulating layer by PECVD;

Step 42, depositing the transparent conductive film by magnetron sputtering or thermal evaporation;

Step 43, applying a photoresist layer on the transparent conductive film;

Step 44, performing a exposing process by using a half-tone mask or a gray-tone mask to form a photoresist-completely-removed region, a photoresist-wholly-retained region and a photoresist-partially-retained region, wherein the photoresist-completely-removed region corresponds to the region where a pattern to be formed of the gate pad via hole and the data pad via hole is, the photoresist-wholly-retained region corresponds to the region where a pattern to be formed of the storage electrode is, and the photoresist-partially-retained region corresponds to the region other than the above regions, and wherein after a developing process, the thickness of the photoresist in the photoresist-wholly-retained region remains unchanged, the photoresist in the photoresist-completely-removed region is completely removed, and the thickness of the photoresist in the photoresist-partially-retained region is reduced;

Step 45, completely etching the transparent conductive film and the corresponding insulating film in the photoresist-completely-removed region by a first etching process, so as to form a pattern of the gate pad via hole and the data pad via hole;

Step 46, removing the photoresist in the photoresist-partially-retained region by an ashing process to expose the transparent conductive film in this region;

Step 47, completely etching the transparent conductive film in the photoresist-partially-retained region by a second etching process to form a pattern of the storage electrode; and Step 48, peeling off the remaining photoresist.

The technology of the embodiment offers an approach in which a pattern of the gate pad via hole, the data pad via hole, and the storage electrode are formed at the same time by one patterning process using a half-tone mask or a gray-tone mask. The details thereof have been described in the technology shown in FIG. 15 to FIG. 19, and thus the explanation thereof is omitted for brevity's sake.

It should be appreciated that the embodiments described above are intended merely to illustrate, not to limit, the invention. Although the invention has been described in detail herein with reference to the preferred embodiments, it should be understood by those skilled in the art that the invention can be modified and some of the technical features can be substituted without departing from the spirit and scope of the invention.

What is claimed is:

1. A method of manufacturing a thin film transistor liquid crystal display (TFT-LCD) array substrate, comprising steps of:

Step 1, depositing, successively, a light-blocking metal film, a first insulating layer, a semiconductor film, and a doped semiconductor film on a base substrate, and forming a pattern including a light-blocking metal layer and an active layer with a patterning process;

Step 2, depositing, successively, a transparent conductive film and a source and drain metal film on the base substrate after Step 1, and forming a pattern including a data line, a drain electrode, a source electrode, a thin film transistor (TFT) channel region, and a pixel electrode with a patterning process, wherein the drain electrode is directly connected with the pixel electrode through the transparent conductive layer, and the transparent conductive layer below the drain electrode is continuously formed together with the pixel electrode;

Step 3, depositing, successively, a second insulating layer and a gate metal film on the base substrate after Step 2, and forming a pattern including a gate electrode and a gate line with a patterning process, wherein the gate electrode is located above the TFT channel region; and Step 4, depositing, successively, a third insulating layer and a transparent conductive film on the base substrate after Step 3, and forming a pattern including a storage electrode, a gate pad via hole, and a data pad via hole, wherein the storage electrode overlaps with the pixel electrode and, together with the pixel electrode, constitutes a storage capacitor.

2. The method of manufacturing the TFT-LCD array substrate according to claim 1, wherein the Step 1 includes:

depositing the light-blocking metal film on the base substrate by magnetron sputtering or thermal evaporation;

depositing, successively, the first insulating layer, the semiconductor film, and the doped semiconductor film in this order by plasma enhanced chemical vapor deposition (PECVD); and patterning the doped semiconductor film, the semiconductor film, the first insulating layer, and the light-blocking metal film by a patterning process with a normal mask to form a pattern including the light-blocking metal layer and the active layer.

3. The method of manufacturing the TFT-LCD array substrate according to claim 1, wherein the Step 2 includes:

depositing, successively, the transparent conductive film and the source and drain metal film by magnetron sputtering or thermal evaporation;

applying a photoresist layer on the source and drain metal film;

performing a exposing process through using a half-tone mask or a gray-tone mask to form a photoresist-completely-removed region, a photoresist-wholly-retained region, and a photoresist-partially-retained region, wherein the photoresist-wholly-retained region corresponds to the region where a pattern to be formed of the data line, the source electrode, and the drain electrode is, the photoresist-partially-retained region corresponds to the region where a pattern to be formed of the pixel electrode is, and the photoresist-completely-removed region corresponds to the region other than the above regions, and wherein after a developing process, the thickness of the photoresist in the photoresist-wholly-retained region remains unchanged, the photoresist in the photoresist-completely-removed region is completely removed, and the thickness of the photoresist in the photoresist-partially-retained region is reduced;

completely etching the source and drain metal film and the transparent conductive film in the photoresist-completely-removed region by a first etching process, so as to form a pattern of the data line, the source electrode, the drain electrode, and the TFT channel region, wherein one end of the source electrode is formed on the active layer and the other end of the source electrode is connected with the data line, one end of the drain electrode is formed on the active layer against the source electrode, the TFT channel region is formed between the source electrode and the drain electrode, and the source and drain metal film, the transparent conductive film, and the doped semiconductor layer in the TFT channel region are completely etched, and the semiconductor layer in the TFT channel region is partially etched in the thickness direction thereof, so as to expose the semiconductor layer in the TFT channel region;

removing the photoresist in the photoresist-partially-retained region by an ashing process to expose the source and drain metal film in this region;

completely etching the source and drain metal film in the photoresist-partially-retained region by a second etching process, so as to form a pattern of the pixel electrode, wherein the pixel electrode is directly connected with the drain electrode; and peeling off the remaining photoresist.

4. The method of manufacturing the TFT-LCD array substrate according to claim 1, wherein the Step 3 includes:

depositing the second insulating layer by plasma enhanced chemical vapor deposition (PECVD);

depositing the gate metal film by magnetron sputtering or thermal evaporation; and patterning the gate metal film by a patterning process with a normal mask to form a pattern including the gate electrode and the gate line, wherein the gate electrode is located above the TFT channel region.

5. The method of manufacturing the TFT-LCD array substrate according to claim 1, wherein the step 4 includes:

depositing the third insulating layer by plasma enhanced chemical vapor deposition (PECVD);

depositing the transparent conductive film by magnetron sputtering or thermal evaporation;

applying a photoresist layer on the transparent conductive film;

performing a exposing process by using a half-tone mask or a gray-tone mask to form a photoresist-completely-removed region, a photoresist-wholly-retained region and a photoresist-partially-retained region, wherein the photoresist-completely-removed region corresponds to the region where a pattern to be formed of the gate pad via hole and the data pad via hole is, the photoresist-wholly-retained region corresponds to the region where a pattern to be formed of the storage electrode is, and the photoresist-partially-retained region corresponds to the region other than the above regions, and wherein after a developing process, the thickness of the photoresist in the photoresist-wholly-retained region remains unchanged, the photoresist in the photoresist-completely-removed region is completely removed, and the thickness of the photoresist in the photoresist-partially-retained region is reduced;

completely etching the transparent conductive film and the corresponding insulating film in the photoresist-completely-removed region by a first etching process, so as to form a pattern of the gate pad via hole and the data pad via hole;
removing the photoresist in the photoresist-partially-retained region by an aching process to expose the transparent conductive film in this region;
completely etching the transparent conductive film in the photoresist-partially-retained region by a second etching process to form a pattern of the storage electrode; and
peeling off the remaining photoresist.

* * * * *